US009599689B2

(12) United States Patent
Horger et al.

(10) Patent No.: US 9,599,689 B2
(45) Date of Patent: Mar. 21, 2017

(54) MAGNETIC RESONANCE IMAGING METHOD AND APPARATUS

(71) Applicants: Wilhelm Horger, Schwaig (DE); Bernd Kuehn, Uttenreuth (DE); Andre de Oliveira, Erlangen (DE)

(72) Inventors: Wilhelm Horger, Schwaig (DE); Bernd Kuehn, Uttenreuth (DE); Andre de Oliveira, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 689 days.

(21) Appl. No.: 14/036,265

(22) Filed: Sep. 25, 2013

(65) Prior Publication Data

US 2014/0084921 A1 Mar. 27, 2014

(30) Foreign Application Priority Data

Sep. 25, 2012 (DE) .................. 10 2012 217 262

(51) Int. Cl.
*G01R 33/48* (2006.01)
*G01R 33/563* (2006.01)
*G01R 33/56* (2006.01)

(52) U.S. Cl.
CPC ....... *G01R 33/48* (2013.01); *G01R 33/56383* (2013.01); *G01R 33/5608* (2013.01)

(58) Field of Classification Search
CPC .......... G01R 33/56383; G01R 33/4833; G01R 33/56391; G01R 33/56375
See application file for complete search history.

(56) References Cited

U.S. PATENT DOCUMENTS

| 7,787,684 | B2* | 8/2010 | Beck ............... A61B 5/055 128/916 |
| 9,157,977 | B2* | 10/2015 | Ohiwa ............ G01R 33/4833 |
| 2002/0087069 | A1* | 7/2002 | Ho ................ G01R 33/56375 600/415 |
| 2003/0083569 | A1* | 5/2003 | Edelman ......... G01R 33/56375 600/410 |
| 2005/0264286 | A1 | 12/2005 | Harder |
| 2006/0058630 | A1* | 3/2006 | Harvey ............ G01R 33/5611 600/410 |
| 2007/0167730 | A1* | 7/2007 | Tatebayashi ....... G01R 33/4833 600/410 |
| 2008/0205725 | A1* | 8/2008 | Schmitt ............ A61B 5/055 382/130 |
| 2009/0003674 | A1* | 1/2009 | Keupp ............ G01R 33/56375 382/131 |
| 2009/0219020 | A1* | 9/2009 | Kurokawa ....... G01R 33/56375 324/309 |
| 2010/0119136 | A1* | 5/2010 | Itagaki ............ A61B 5/055 382/131 |

(Continued)

*Primary Examiner* — Clayton E Laballe
*Assistant Examiner* — Ruifeng Pu
(74) *Attorney, Agent, or Firm* — Schiff Hardin LLP

(57) ABSTRACT

In a method and apparatus for automatic magnetic resonance imaging of a patient, an MR overall image is composed from several MR partial images. An MR overview image is received by a process that determines several scanning ranges based on the MR overview image. The MR scanning ranges are characterized by a length along a first direction. For all MR scanning ranges: the length along the first direction is set equal to the length of the longest MR scanning range in the first direction.

11 Claims, 11 Drawing Sheets

(56) References Cited

U.S. PATENT DOCUMENTS

| | | | |
|---|---|---|---|
| 2011/0153255 A1 | 6/2011 | Horger et al. | |
| 2011/0184273 A1* | 7/2011 | Riederer | G01R 33/5611 600/410 |
| 2011/0206260 A1* | 8/2011 | Bergmans | G01R 33/543 382/131 |
| 2012/0283549 A1* | 11/2012 | Miyazaki | G01R 33/5673 600/413 |
| 2013/0113486 A1* | 5/2013 | Imamura | G01R 33/341 324/322 |
| 2013/0187651 A1* | 7/2013 | Konta | G01R 33/5611 324/309 |

* cited by examiner

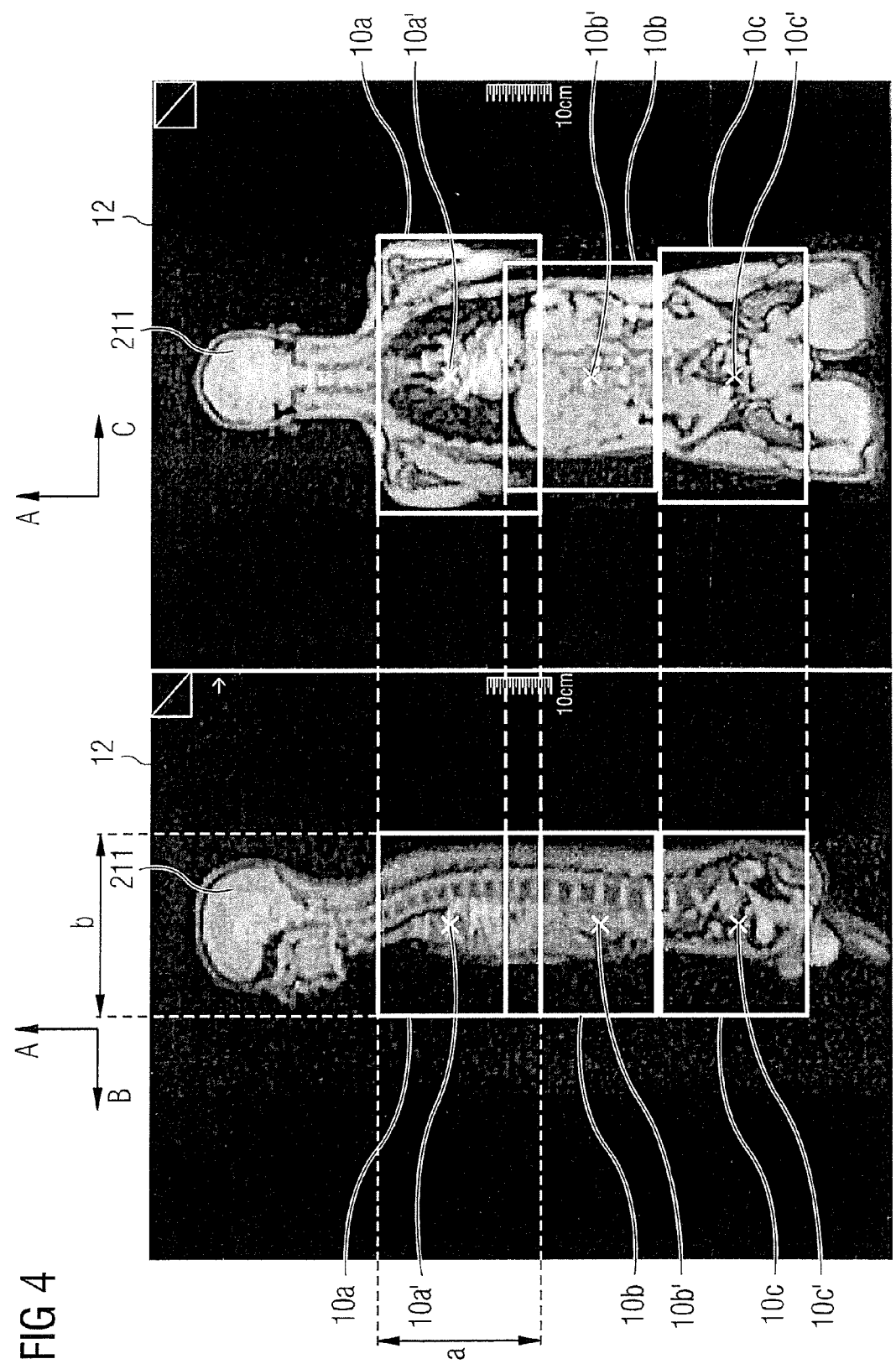

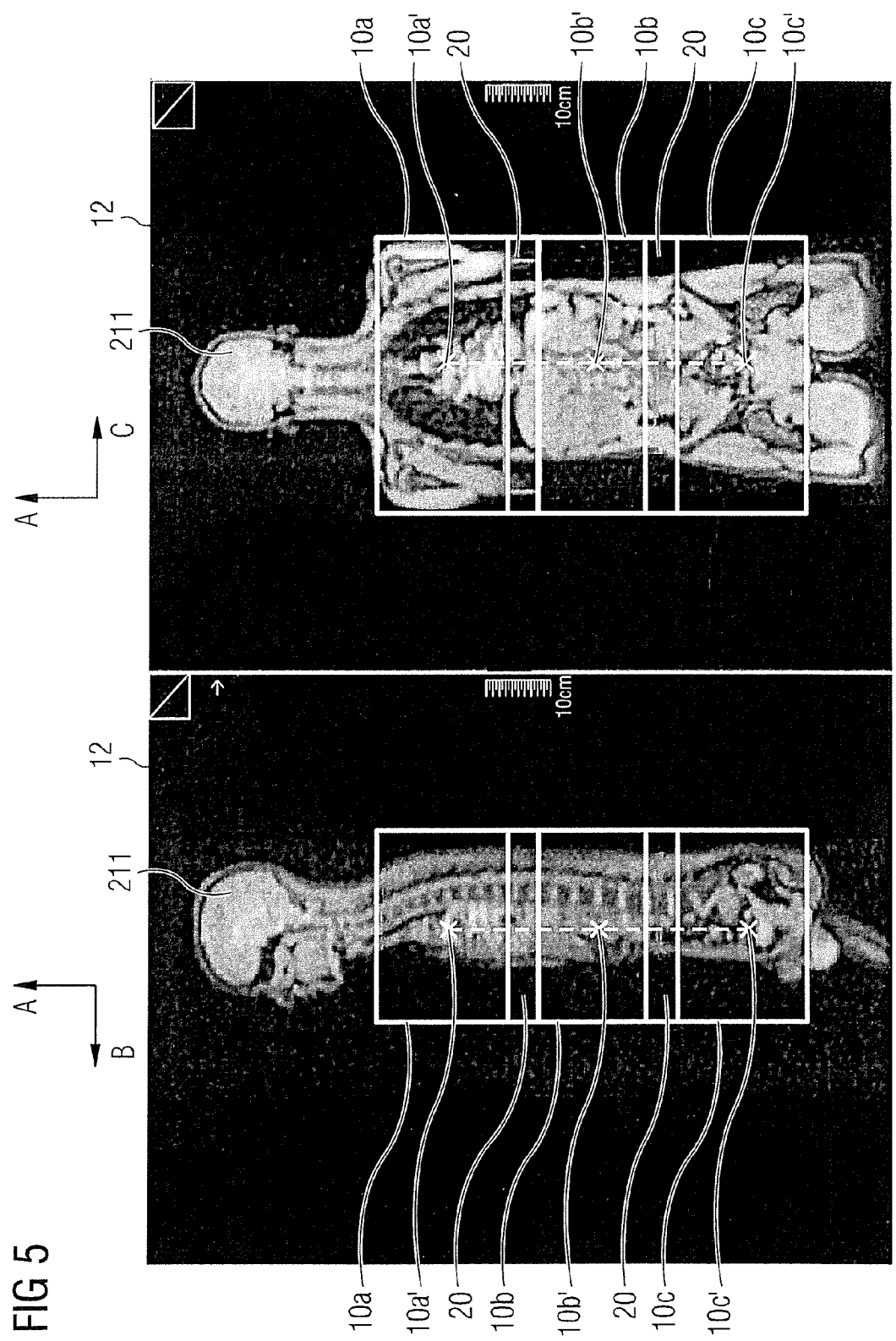

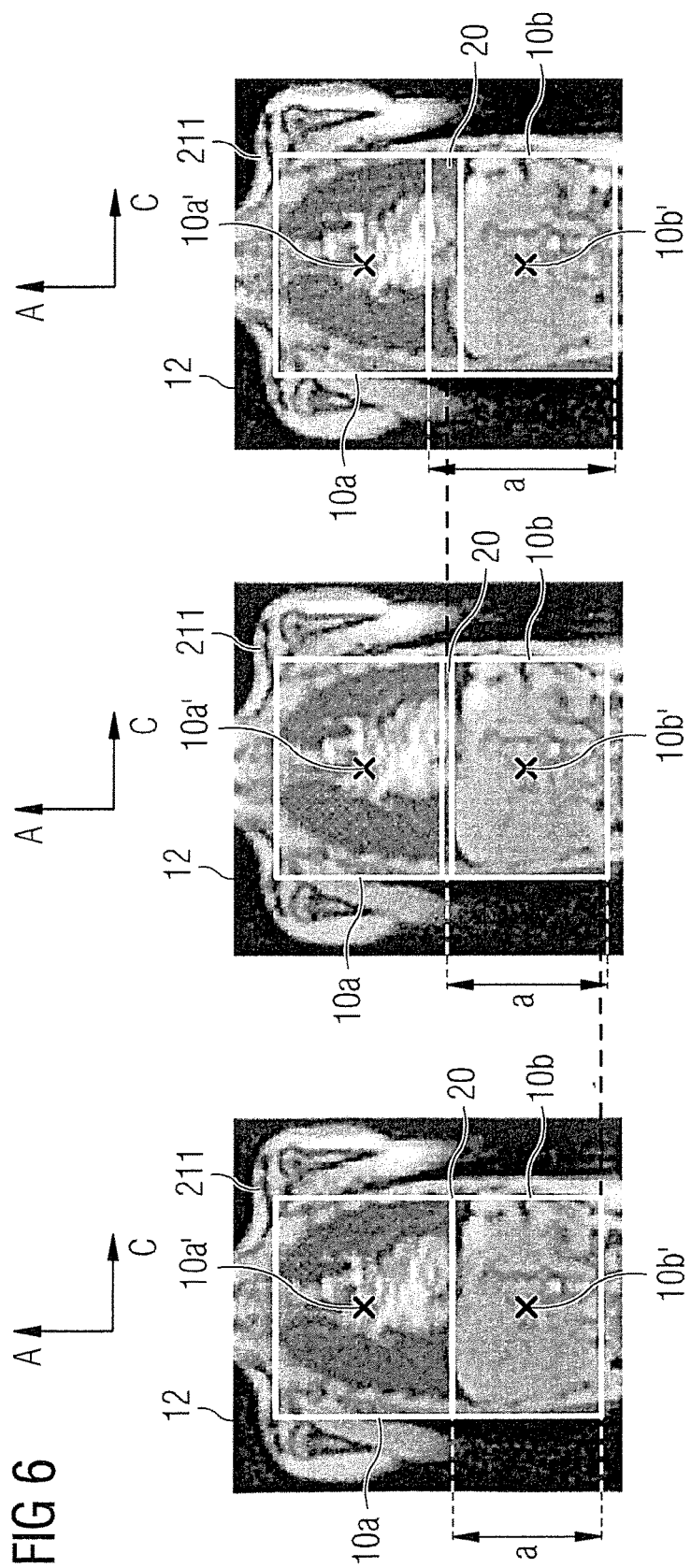

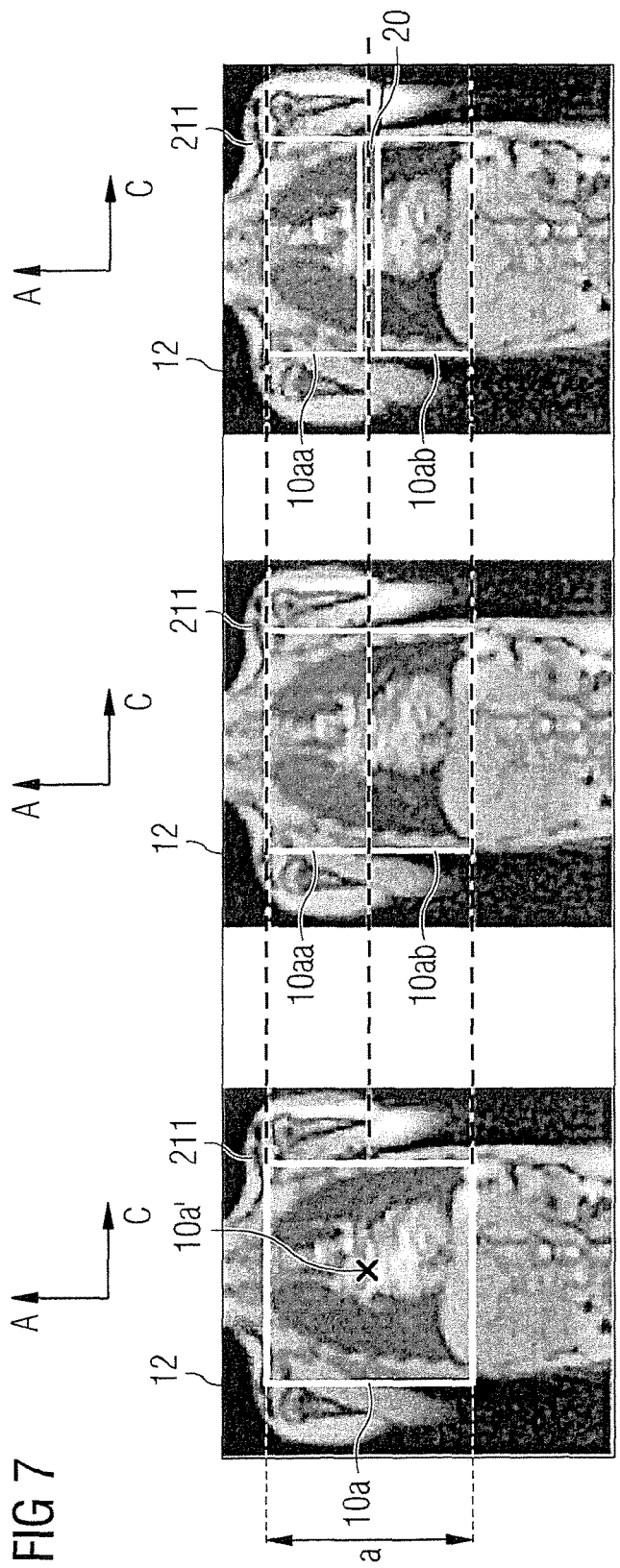

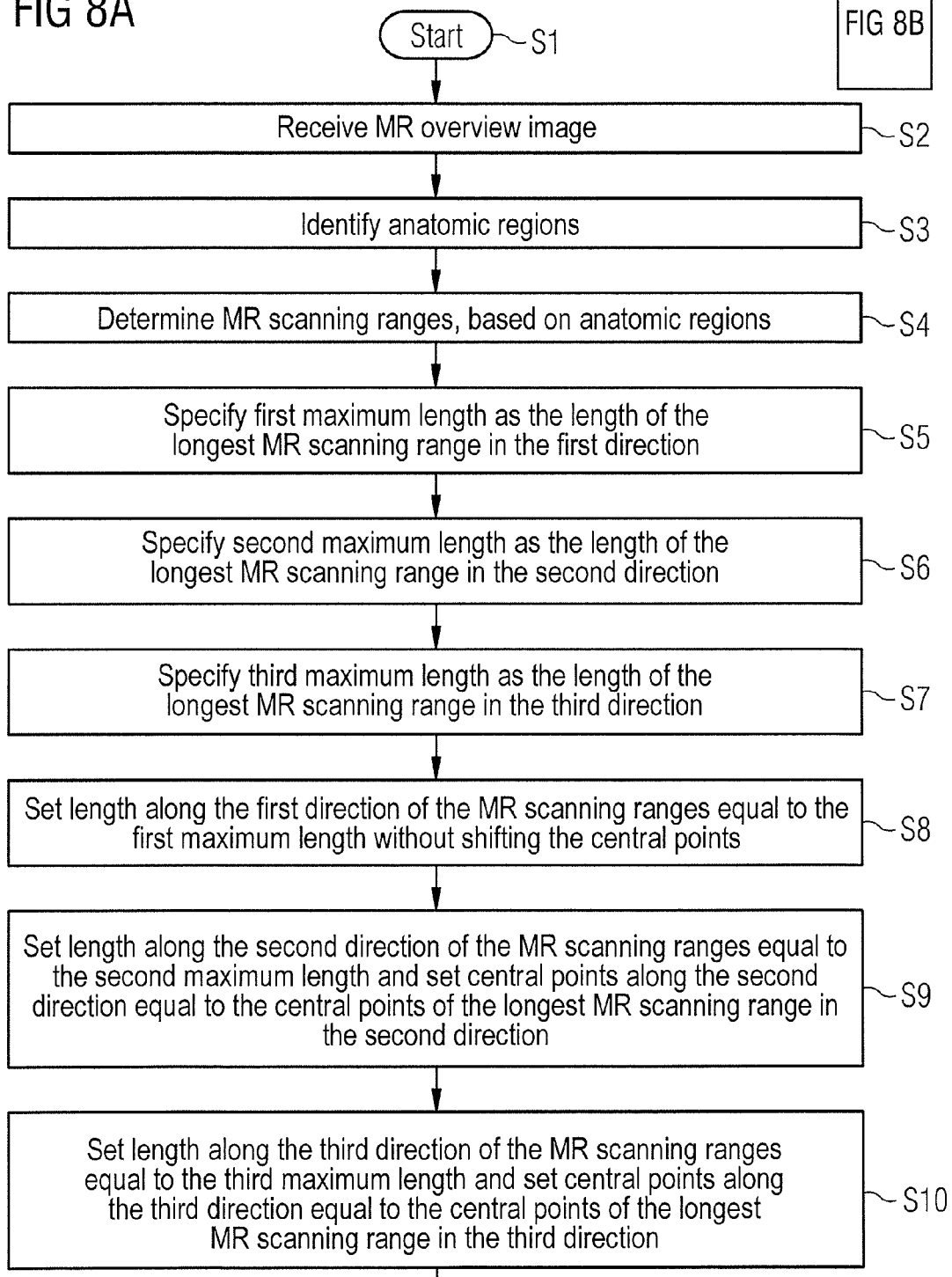

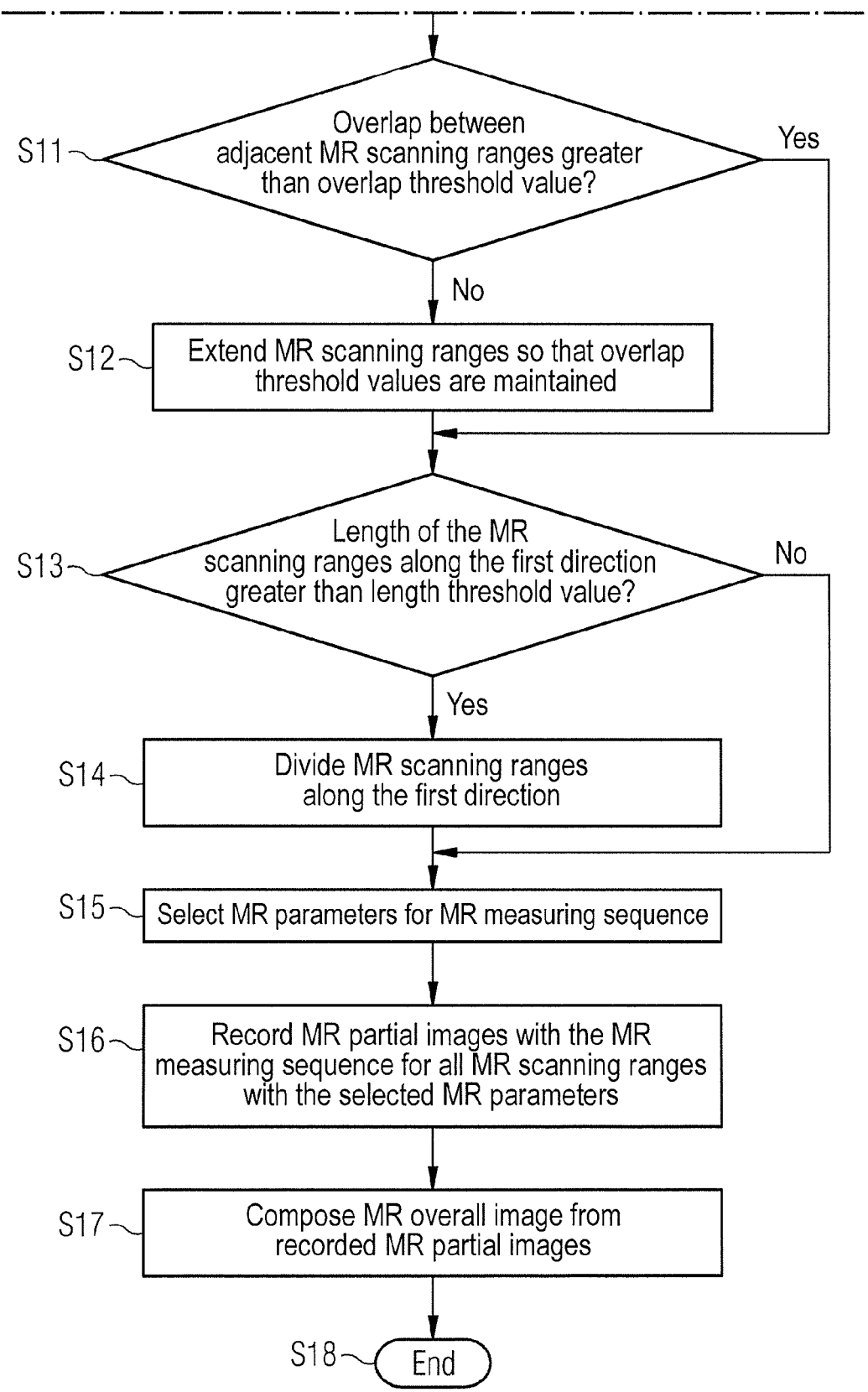

MAGNETIC RESONANCE IMAGING METHOD AND APPARATUS

BACKGROUND OF THE INVENTION

Field of the Invention

The present invention concerns techniques for automatic magnetic resonance imaging in which a magnetic resonance overall image is composed of several magnetic resonance partial images. In particular, the invention concerns such techniques that allow for an automatic determination of various magnetic resonance scanning ranges respectively for which a magnetic resonance partial image is recorded.

Description of the Prior Art

In recent years, magnetic resonance (MR) tomography has been established as an important imaging modality for examining objects, especially in medical diagnostics. For this purpose, magnetic moments (spins) of nuclei are deflected from their rest position (which typically lies parallel to a basic magnetic field of several Tesla) by irradiating radio-frequency (RF) pulses, and the signal emitted during relaxation of the spins is used for imaging. A special application area of MR imaging is the reproduction of large body regions, even up to the entire body, which are referred to as multi-station or whole-body MR imaging).

Typically, imaging region within an MR system has only limited dimensions that may be smaller than the body region to be imaged. Therefore, it is often required to compose an MR overall image from several MR partial images. For this purpose, the patient can be positioned at different positions within the MR system by a moveable and positionable bed or table. In this way, different regions of the patient come to be in the imaging volume of the MR system and thus the different partial images of the different regions can be recorded. Then it is possible to compose the MR overall image from the MR partial images. Typically, the imaging volume is defined by operational parameters of the MR system that are constant within tolerance ranges. Typically, the imaging volume is centered at an isocenter of the MR system, close to the geometric center of the basic field magnet.

However, present-day methods for multi-station MR imaging entail a number of limitations. For example, it can be required that the medical personnel have to implement many manual and complicated steps for planning the various positions of the patient from whom the MR partial images are being recorded. This can be very time-consuming and expensive. It is also not possible to preclude errors in the planning process, which could possibly limit subsequent medical diagnostics.

Therefore, there is a need for improved methods and systems for multi-station MR imaging. In particular, there is a need for methods and systems that allow for automated and simple multi-station MR imaging.

SUMMARY OF THE INVENTION

The invention relates to a method for automated MR imaging of a patient, wherein an MR overall image is composed from several MR partial images that are recorded along a first direction with different positions of the patient. The method involves receiving an MR overview image into a processor, the overview representing the patient and the processor determines several scanning ranges based on the received MR overview image, each of which at least partially contains an anatomic region of the patient. The MR scanning ranges are characterized by a length along a first direction. The method furthermore includes the determination in the processor of a first maximum length along the first direction, the first maximum length corresponding to the length of the longest MR scanning range in the first direction. Moreover, the method includes for all MR scanning ranges, setting the length along the first direction to equal the first maximum length. Furthermore, the method includes for all MR scanning ranges, positioning the patient along the first direction and determining the MR partial image that represents the patient within the respective MR scanning range. Moreover, the method includes a composing of the MR overall image from the MR partial images of the MR scanning ranges.

Such techniques can be described as automated multi-station MR imaging or whole-body MR imaging and can be performed with MR systems generally known to those skilled in the art. However, in this context, the term "whole-body" should not be viewed in a restrictive manner. It is also possible to implement the MR imaging for sub-regions of the entire body of the patient.

For example, the first direction can be oriented along or parallel to the central axis of a tube of the basic field magnet of the MR system. The basic field magnet, in turn, can be oriented in relation to a gradient system for generating spatial encoding gradient fields. These elements can define an apparatus coordinate system of the MR system. For example, the first direction can be perpendicular to a slice-selection direction of the spatially encoding gradient fields. Typically, the patient can be arranged on a table or bed within the MR system, with the table or bed being positionable or movable along the first position. The positioning along the first direction can take place such that the respective MR scanning range is located within the imaging volume of the MR system. This achieves the operational parameters of the MR imaging for all MR partial images recorded for the MR scanning ranges being located within specified areas. Therefore, the MR partial images have no or only insignificant errors, such as, for example, spatial distortion.

Different technologies for receiving the MR overview image are available. For example, well-known technologies involve continuous moving table acquisition along the first direction (for example, with a constant speed or in increments). With such technologies, it is possible, for example, to use constant slice-selection gradient fields. Such technologies can provide the MR overview image within a limited period of time. However, it is important to understand that typically the MR overview image that is recorded with such technologies has only a limited spatial resolution and can be used only in a limited manner for subsequent diagnostics or other medical applications. Therefore, it can be advantageous to provide the MR overall image.

Generally, it is also possible to obtain the MR overview image with separate imaging, for example, computed tomography (CT) or positron emission tomography (PET) or MR imaging at a later point in time, for example in a separate test step. Furthermore, the method can involve the registration of the patient in a reference coordinate system (for example, the machine coordinate system of the MR system), so that, in turn, points within the MR overview image can be associated with positions of the patient within the MR system.

The method can also include automatically determining the anatomic regions in the MR overview image by means of image recognition technologies. For example, an automatic determination of the anatomic region can take place by means of landmark recognition in the MR overview image. The anatomic regions can include individual organs, such as liver, kidney, etc., individual body regions, such as head, chest, abdomen or pelvis. However, this classification is not restrictive and be varied, depending on the intended medical application.

The MR scanning ranges can be determined based on the anatomic regions. The MR scanning ranges can be determined such that each MR scanning range includes at least partially anatomic regions selected from the following group: head, neck, shoulders, lungs, abdomen, pelvis, thigh, lower leg, foot. The MR scanning ranges can be determined in such a way that different anatomic regions of the patient are included at least in an MR scanning range and/or the relevant regions of the patient are basically divided in anatomic regions, so that the MR scanning ranges basically cover all relevant regions of the patient. Since each MR scanning range can at least partially include one anatomic region of the patient, the determination of the MR scanning ranges can comprise the grouping or arranging of several anatomic regions. At the same time, the determination of the MR scanning ranges can be based on medical aspects. For example, anatomic regions which are preferably used as a whole for medical diagnostics can be included completely or partially in an MR scanning range. Typical MR scanning ranges are associated with head, chest, abdomen or pelvis. However, it is possible to use different variations, and professionals are familiar with these technologies so that it is not necessary to provide further details. Also the selection of the anatomic regions is not particularly limited.

Determining the first maximum length and setting the length equal to the maximum length for all MR scanning ranges can also be described as: using for all MR scanning ranges the length of the longest MR scanning range along the first direction. In other words, the parameter "length along the first direction" of the different MR scanning ranges can be adjusted to all MR scanning ranges, namely equal to the longest length.

It should be understood that it is generally possible to adjust to one another further or all parameters of the different MR scanning ranges, for example, lengths along a first direction of orthogonal directions and/or geometric arrangements of edges and corners and/or overlap of adjacent MR scanning ranges and/or parameters of a measuring sequence, with which the MR partial images are recorded, associated with the MR scanning ranges. This may allow for a simplification of the process of assembling the MR partial images to an MR overall image. By adjusting different parameters that are associated with the MR scanning ranges, it is possible to generate a uniform and consistent MR overall image, because the individual MR partial images are recorded for adjusted MR scanning ranges. For example, this can increase the usability of the MR overall image for medical applications. Furthermore, the manual and time-consuming planning of MR scanning ranges can be avoided. In contrast to conventional technologies, which involve a variety of manual planning steps, the invention provides fully automated multi-station MR imaging. This can result in a low error level, a faster planning phase and thus a reduction in costs.

The procedure for positioning along the first direction can be described as follows. The patient is arranged at different positions along the first direction. In particular, it is possible that the imaging volume of the respective MR system is restricted. For example, reliable data acquisition may only be possible within a limited volume in the vicinity of the isocenter of the respective MR system, wherein MR data are recorded with such minimal errors or uncertainties that the data are within a range of tolerance or within the specifications of the respective MR system. For greater distances from the isocenter of the respective MR system, inconsistencies of the basic magnetic field and/or non-linearities of the gradient fields used for spatial encoding in MR imaging can become greater than a threshold value. For example, this can result in spatial distortions within the MR data (misrepresentation of pixels of the MR images). In other words: MR images that are recorded (acquired) outside of the imaging volume of the MR system can show a lack of correct spatial positioning of the pixels. Therefore, the positioning of a patient can take place such that, at the respective positions of the patient, the respective MR scanning regions are arranged completely or partially within the imaging volume of the respective MR system. In other words, the positioning of the patient can take place such that the respective MR partial image shows distortions that are smaller than a predetermined threshold value.

The composition of the MR overall image can take place by appropriate techniques with those of ordinary skill in the art are basically familiar. It should be understood that specific technologies can place certain requirements on the quality of the MR partial images (for example, with regard to overlap, dimensions of the MR partial images, contrast, etc.), so that a determination of the various MR scanning ranges and the subsequent steps can be implemented. The composition of an MR overall image can take place in a subsequent procedural stage, so-called post-processing, which does not have to be in particularly close time correlation to the preceding steps.

For example, setting the length along the first direction can take place such that the position of a central point of the MR scanning range remains basically constant.

For example, if the length along the first direction of a specific MR scanning range is extended to be equal to the maximum length, the extension can take place in equal proportions right and left (or any desired definition) of the center of the specific MR scanning range along the first direction. In other words, the specific MR scanning range can be extended along the first direction by the same amount on both sides of the central point. In that way, the position of the central point of the specific MR scanning range can remain constant. For example, a basically constant position of the central point can still encompass a minor change of position, wherein minor can be defined with regard to the length of the respective MR scanning range and/or a pixel of the associated MR partial image. The same applies to the subsequently described embodiments.

Furthermore, the MR scanning ranges can be characterized by a length in a second direction and by a length in a third direction, with the first direction and the second direction and the third direction being orthogonal. In addition, the method can include determining a second maximum length along the second direction, the second maximum length corresponds to the length of the longest scanning range in the second direction, and determining a third maximum length along the third direction, wherein the third maximum length is corresponding to the length of the longest scanning range in the third direction, and for all MR scanning ranges, setting the length along the second direction equal to the second maximum length, and for all MR scanning ranges, setting the length along the third direction equal to the third maximum length.

For example, the first, second and third directions can define an orthogonal coordinate system, which is correlated with the apparatus coordinate system of the MR system. The MR partial images can be recorded with spatially encoding grading fields, which are respectively set along the first direction or the second direction or the third direction. For example, the first direction can be oriented along the axis of the tube of the respective MR system (the so-called transverse direction perpendicular to a slice-selection direction of the spatially encoding grading fields) and the second and the third directions can each be perpendicular to the first direction. For example, the second direction can be perpendicular to the phase-selection direction of the spatial encoding gradient fields and the third direction can be perpendicular to the frequency-selection direction of the spatial encoding gradient fields. Then, the second and the third directions can be depicted as longitudinal directions, i.e., they can be perpendicular to the transverse direction. It should be understood the invention allows for minor tilts of the individual axes to one another.

According to the above-mentioned embodiments for adjusting the length along the first direction, it is also possible to adjust the length of the MR scanning ranges along the second and third directions, respectively. Thus it can be accomplished by the MR scanning ranges having the same dimensions, respectively, along the first, second and third directions. In other words, MR scanning ranges can have the same volume. This can result in a precise composition of the MR overall image and, subsequently, in especially simple medical interpretation.

It is possible to set the length along the second direction such that the position of a central point of the MR scanning range along the second direction is, for all MR scanning ranges, basically equal to the position of the central point of the longest MR scanning range in the second direction. It is also possible to set the length along the third direction such that the position of a central point of the MR scanning range along a third direction is, for all MR scanning ranges, basically equal to the position of the central point of the longest MR scanning range in the third direction.

In other words, in contrast to the adjustment of the length along the first direction in the above-mentioned embodiment, it is possible to extend the MR scanning ranges along the second and third directions unequally on the right and left side of the respective central point, namely such that the (new) central point is basically equal to the central point of the longest MR scanning range along the second or third direction. Thus, an adjustment of the MR scanning ranges can take place such that the edges or borders are congruent. This means that the length along the second direction can be set in a manner in which the borders of the respective MR scanning range along the second direction basically coincide with the borders of the longest MR scanning range in the second direction. Additionally, the length along the third direction can be set so that the borders of the respective MR scanning extent along the third direction basically coincide with the borders of the longest MR scanning range in the third direction.

This can have advantageous effects for the MR overall image. For example, the MR overall image can have straight edges or well-defined borders. This can make a subsequent medical application easier and result in a clearer arrangement.

The technologies described above allow for an adjustment of the dimensions of the MR scanning ranges along the first direction and/or second direction and/or third direction. It should be understood that for composing the MR overall image from MR partial images of the respective MR scanning ranges, it would be advantageous when the adjacent MR scanning ranges are sufficiently overlapping. As a result, it can be assured that the adjacent MR scanning ranges are correctly composed during the composition process.

Furthermore, the method can include for all MR scanning ranges, implementing a threshold value comparison that compares an overlap along the first direction of the respective MR scanning range with adjacent scanning ranges using a predetermined overlap threshold. In addition, depending on the threshold value comparison, the method can include the selective extension of the length along the first direction for all MR scanning ranges.

For example, the overlap can be defined as the region that includes the respective MR scanning range and the adjacent MR scanning range (intersection). The extension can take place such that the extended overlap is greater than or equal to the overlap threshold value. For this purpose, the scanning range can be extended by a difference length. The extension can take place separately or collectively for adjacent MR scanning ranges that are arranged along the first direction on the left and right side (here, and subsequently any desired definition) in relation to the central point.

For example, the threshold value comparison can be performed separately for the adjacent MR scanning ranges that are arranged along the first direction on the left or right side in relation to the central point of the respective MR scanning range. Correspondingly, the selective extension along the first direction can be performed for the respective MR scanning ranges by different difference lengths on the left or right side in relation to the central point. As a result, especially the central point of the respective MR scanning range can be shifted through the selective extension along the first direction. However, it is also possible to perform the selective extension along the first direction in such a way that the position of the central point remains basically constant: for example, the selective extension could be performed along the first direction with equal difference lengths on the left and right side in relation to the central point. For example, the difference length can be selected to be equal to the greater of the two difference lengths.

By selectively extending the length along the first direction, it can be ensured that the composition of the MR overall image from the MR partial images can always resort to a sufficiently great overlap between adjacent MR partial images. This can increase the precision of the composition.

It is possible for all MR partial images to be recorded with the same MR measuring sequence.

Recording all MR partial images with one and the same measuring sequence has the advantage that the different MR partial images have equal image parameters, for example, pixel resolution, etc. As a result, it is possible to receive a consistent MR overall image. In particular, it is possible to compose the MR overall image from the MR partial images in a simple and reliable manner. For example, it may not be necessary that the composition comprises elements selected from the following group: scaling, rotating, turning, compressing, tilting, interpolating.

The MR measuring sequence can be characterized at least by parameters selected from the following group: number of pixels, concentration of pixels, echo times, repeat time between high frequency excitation pulses. The MR overview image can have a lower concentration of pixels than the multiple MR partial images.

Furthermore, the MR parameters can describe the type of MR measuring sequence, for example, gradient echo or spin echo or turbo spin echo, etc. In addition, the MR parameters can depict the use and parameters (for example, acceleration factor) of accelerated parallel MR imaging as, for example, generalized auto-calibrating partially parallel acquisition (GRAPPA) or sensitivity encoding (SENSE) or derived technologies.

The same MR measuring sequence can be describes as: equal or basically equal selection of individual or several or all MR parameters. In particular, the number of pixels for all MR partial images can be selected equally. Alternatively or additionally, it is possible to select an acceleration factor for specific MR scanning ranges, which, for example, involve less critical anatomic region, that is higher than the acceleration factor for different MR scanning ranges. As mentioned above, it is also possible to select an equal volume or the same dimensions of the different MR scanning ranges and thus the MR partial images, which can mean: equal concentration of pixels or equal image resolution for all MR partial images. In particular, this means that the different MR partial images have an equal scaling or magnification factor. As a result, the MR overall image can be composed in a particularly consistent and uniform manner from several MR partial images. The above-mentioned examples are only exemplary; other dependencies may exist.

Furthermore, the method can include the determination of the MR parameters depending on the lengths of the MR scanning ranges.

In particular, different MR parameters can have an influence on the time period required for performing the respective MR measuring sequence. For example, when a greater (smaller) number of pixels or echo time is selected, more (less) time can be required for performing the respective MR measuring sequence. Therefore, depending on the length or volume of the MR scanning ranges, the determination of the MR parameters can take place in such a way that the time period required for performing the MR measuring sequence is shorter or equal to a predetermined maximum time period. For example, the predetermined maximum time period can range between 10 and 30 seconds or amount to approximately 20 seconds, basically for all MR scanning ranges. Typically, during such time periods, the patient can hold his breath so that in those phases motion artifacts could be minimized when the MR partial images are recorded. With regard to the different MR parameters, those of ordinary skill in the art know the various dependencies of the time period required for performing the MR measuring sequence. Therefore, it is not necessary to provide a detailed description of the process. Various MR scanning ranges require different predetermined time periods. For example, motion artifacts can be significant (negligible) for MR scanning ranges associated with the lungs (the legs). Accordingly, the predetermined time period can be shorter (longer).

Furthermore, the method can include further threshold value comparison that compares the length of the MR scanning ranges along the first direction with a predetermined length threshold value. It can also include the selective separation of the MR scanning ranges along the first direction in two respective MR scanning ranges depending on the further threshold value comparison.

For example, the selective separation can be performed when the length is greater than the length threshold value. In this regard, the predetermined length threshold value can relate to a dimension of the scanning field of view of the respective MR system. This can have the effect that all MR partial images can be acquired within the imaging volume.

For example, it can occur that the different anatomic regions on the basis of which the MR scanning ranges are determined have a length along the first direction that is longer than a length of the imaging volume of the MR system along the first direction. In such a case, the selective separation of the respective MR scanning range can achieve that the two MR scanning ranges received each have a length that is shorter than the length of the imaging volume of the respective MR system along the first direction.

In summary, in accordance with the invention, it is possible to achieve a number of advantages for automatic multi-station MR imaging. In particular, it is possible to reduce the time required for planning, especially when compared with the currently conventional manual planning. Typically, several minutes can be required for manual planning so that an automatic performance according to the method involving the previously discussed aspects can result in major time savings. Furthermore, it is possible to increase reproducibility: Because of the fact that the planning process is a complex field of responsibility, it may occur that for one and the same patient different users find different solutions for the MR scanning ranges. This can be prevented when the planning process of multi-station MR imaging is performed automatically by means of the above-mentioned clearly defined criteria. Therefore, because of the reduced complexity, multi-station MR imaging can find more acceptance and promotion for use in medical circles.

The invention also concerns to a MR system for automatic MR imaging of a patient, wherein an overall image is composed from several MR partial images, which are recorded with different positions of the patient along a first direction. The MR system has a receiver unit that receives an MR overview image representing the patient. Furthermore, the MR system has a computer unit configured to perform the following steps. Several MR scanning ranges are determined based on the MR overview image received, each of which include at least a portion of one anatomic region of the patient. The MR scanning ranges are characterized by a length along a first direction; and by a determination of a first maximum length along the first direction, the first maximum length being equal to the length of the longest MR scanning range in the first direction; and for all MR scanning ranges: setting the length along the first direction equal to the first maximum length. Furthermore, the computer unit has been arranged to position for all MR scanning ranges the patient along the first direction. In addition, the receiver unit is configured to record each MR partial image that represents the patient within the respective MR scanning range. Furthermore, the computer unit is configured to compose the MR overall image from the MR partial images of the MR scanning ranges.

The MR system is designed to perform the method for automatic MR imaging of a patient.

For such an MR system, advantages are achieved that correspond to the advantages achieved by the method of automatic MR imaging of a patient according to the present invention.

Naturally, it is possible to combine with one another the characteristics of the previously described embodiment and aspects of the invention. In particular, it is possible to use said characteristics not only in the combinations described above but also in different combinations or even separately without departing from the scope of the invention. The terms "left" and "right" or "left side" and "right side", especially when related to the first, second and third direction, should not be viewed in a restrictive manner and can be applied in any desired definition. In particular, they can indicate opposite orientations along the respective direction. For example, the term "basically" can define characteristic dimensions of the overall system, for example, relating to the characteristic linear dimensions.

BRIEF DESCRIPTION OF THE DRAWINGS

FIG. 4 shows MR scanning ranges in an MR overview image prior to adjusting the lengths by means of an invention-based method and an anterior-posterior and left-right view.

FIG. 5 shows the view of FIG. 4, and wherein the MR scanning ranges are represented after adjusting the lengths according to the inventive method.

FIG. 6 shows the selective extension of MR scanning ranges, depending on an overlap threshold value to adjacent MR scanning ranges in a left-right view of the MR overview image.

FIG. 7 shows the selective separation of MR scanning ranges, depending on a length threshold value in a left-right view of the MR overview image.

FIG. 8 is a flowchart of an inventive method (FIGS. 8A and 8B combined).

DESCRIPTION OF THE PREFERRED EMBODIMENTS

Figure 1:
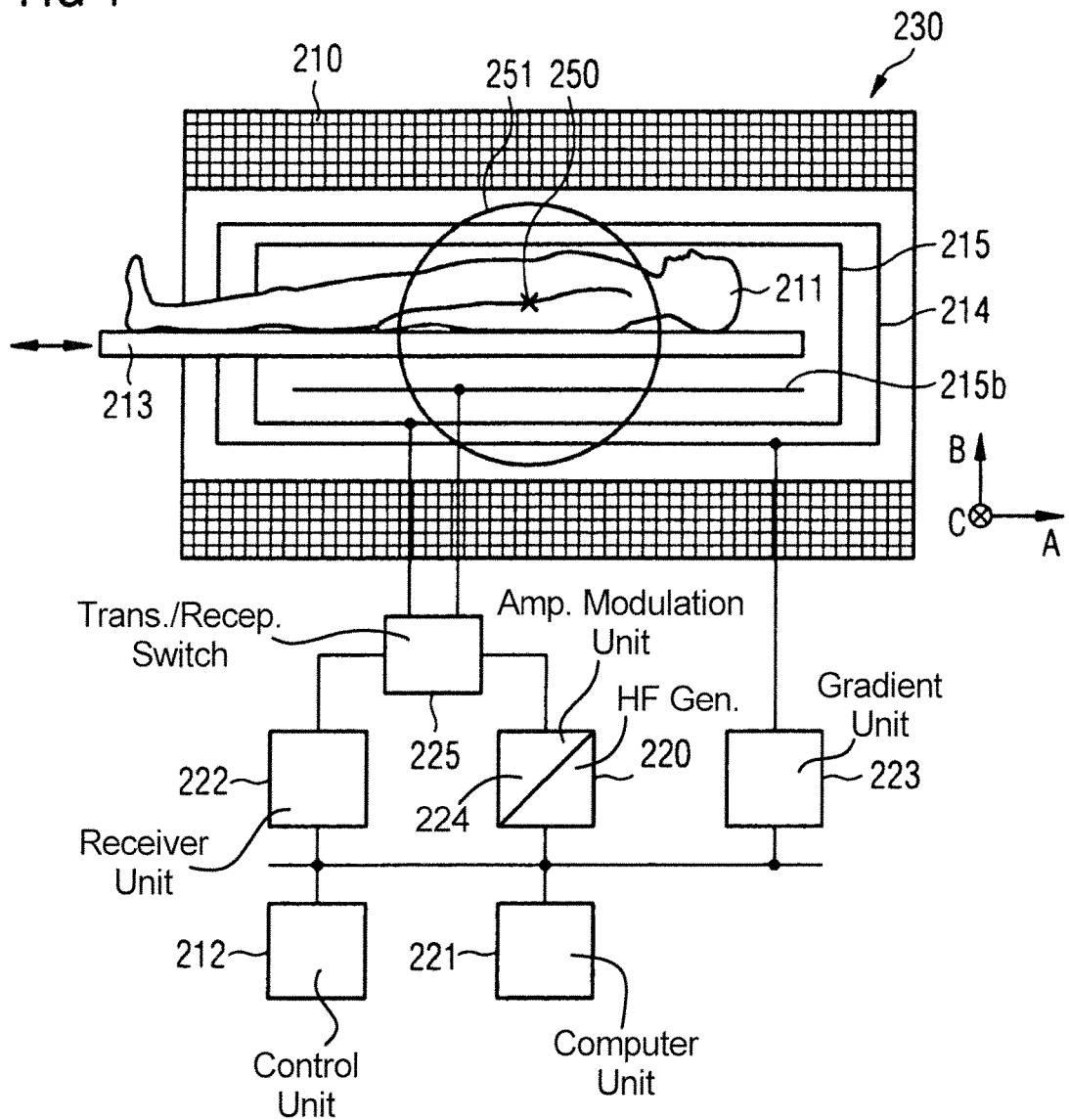
FIG. 1 schematically illustrates an MR system.

The present invention is described in more detail by means of preferred embodiments with reference to the drawings. The different embodiments relate to technologies which allow for automatic planning and for a performance of whole-body MR imaging or multi-station MR imaging. For this purpose, the MR scanning ranges are determined in relation to the anatomic characteristics of a patient and then geometrically adjusted to one another. The MR scanning ranges define the areas of the patient for which subsequently MR partial images are to be recorded. Then, the MR partial images are composed to an MR overall image. Corresponding reference numerals in the figures describe corresponding or similar elements.

FIG. 1 shows a schematic view of a magnet resonance (MR) system 230 according to an embodiment of the present invention. The MR system 230 comprises a magnet 210 for generating a basic magnetic field. For example, the magnet 210 can involve a tubular magnet and the basic magnetic field can be parallel to the longitudinal axis of the tube 212. The longitudinal axis of the tube 212 depicts a first direction A. Perpendicular to the direction A are the second direction B and the third direction C.

A test object, here a patient 211, can be placed on a bed 213 and moved into the magnet 210. The bed 213 can be positioned in a defined manner along the direction A. Furthermore, the MR system 230 comprises a gradient system for generating magnetic field gradients, which are used for imaging and for spatial encoding of recorded MR data. Typically, the gradient system 214 comprises at least three coils or coil assemblies that can be separately controlled, which make it possible to use or operate gradient fields along specific spatial directions (gradient axes). The respective coils are depicted as channels of the gradient system 214. In the MR system 230, the gradient axes involve:

slice selection direction (first direction A),
phase coding direction (second direction B),
frequency coding direction (third direction C).

Therefore, the first direction A is also described as the transverse direction.

For an excitation of the polarization resulting in the basic magnetic field or an adjustment of the magnetization of the nuclear spin, a high frequency (HF) coil assembly 215 and/or a body coil 215b has been provided which can irradiate into the examined patient 211 an amplitude-modulated HF excitation pulse, in order to deflect the magnetization form the rest position (typically parallel to the basic magnetic field), i.e., to generate a transversal magnetization. For a generation of such HF excitation pulses, a high frequency generator 220 and an amplitude modulation unit 224 are used which are connected via a transmit and receive switch 225 with the coils 215, 215b. A gradient module 223 has been provided in order to control the gradient system 214. The MR system 230 has an imaging volume 251 which is surrounded by an isocenter 250. For example, the isocenter 250 can depict a geometric central point of the magnet 211 and the gradient system 214. Points close to (removed from) the isocenter have a high degree (low degree) of homogeneity of the basic magnet field or low (high) non-linearity of the gradient fields. Other operating parameters of the MR system 230 can also be affected. Within the imaging volume 251, a distortion of pixels of an MR image can be in an acceptable area (specification area). Distortions can depict a misrepresentation or spatial shift of pixels in the MR images. Outside the distortions can result in significant corruption. Therefore, MR images are typically only recorded for pixels that are arranged within the imaging volume 251. For this purpose, the bed (table) can be positioned in such a way that the relevant region of the patient 211 is arranged in the imaging volume 251.

A receiver unit 222 of a reception system 225 receives signals of the relaxing transversal magnetization (spin echoes and/or gradient echoes). For this purpose, the receiver unit 222 is connected via the send and receive switch with the HF coil assembly 215 and the body coil 215b.

A control unit 212 allows for in and output from and to a user of the MR system 230. For example, the control unit 212 can have a monitor, a keyboard, a mouse, storage media, data transmission, etc.

Furthermore, a computer unit 221 has been provided which can be used for planning and performing multi-stage MR imaging. The computer unit 221 can comprise a separate unit or can be implemented as a functional unit, as software and/or hardware in a complex computer system, or it can be implemented externally. The computer unit 221 can be set up to control the positioning of the table 213 within the MR system 230.

For multi-stage MR imaging, it is first of all required to record an MR overview image with comparatively low spatial resolution. For this purpose, the table 213 moved with a constant speed or gradually through the magnet 210, and the respective portion of the patient close to the isocenter 250 can be recorded. The respective technologies are basically known to a professional.

In the MR overview image anatomic regions of the patient 211 can be determined automatically, for example, by means of technologies involving object recognition. Then, MR scanning ranges can be determined based on the anatomic regions.

Figure 2:
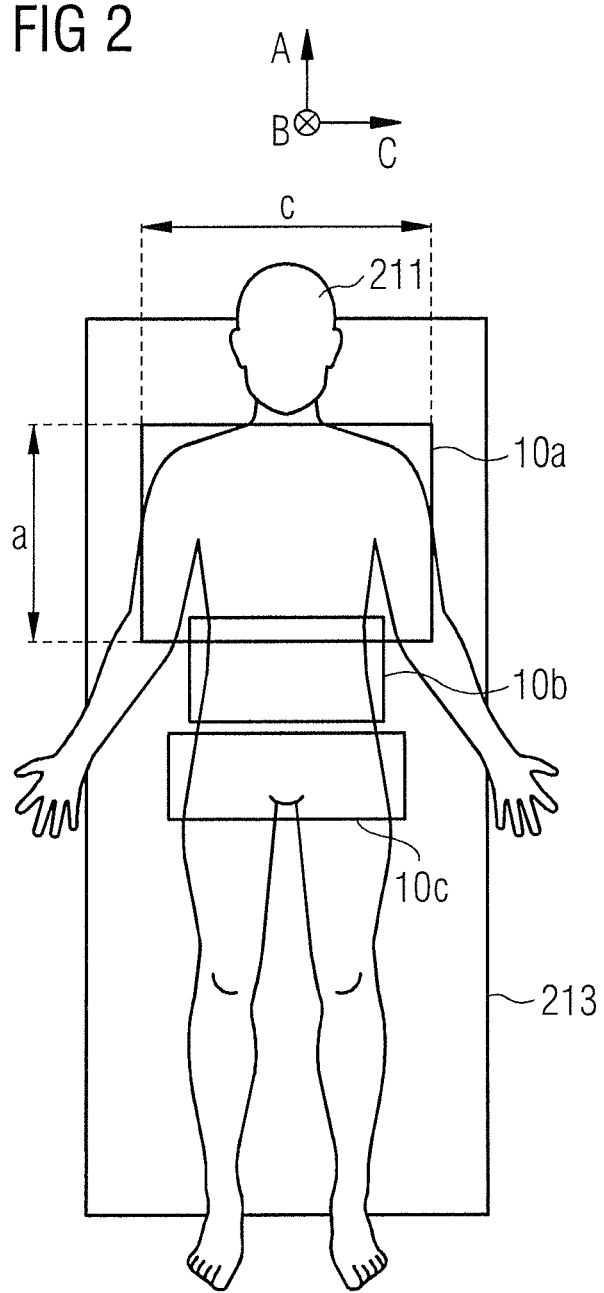
FIG. 2 schematically shows MR scanning ranges in relation to a patient along a first and a third direction.

FIG. 2 provides a detailed view of the MR scanning ranges 10a, 10b, 10c. FIG. 2 shows a top view of the patient 211 lying on a bed 213. For the MR scanning range 10a, FIG. 2 shows in an exemplary manner the length a along the first direction A, as well as the length c along the third direction C. FIG. 2 does not show the length b along the second direction B. FIG. 2 demonstrates that the MR scanning ranges 10a, 10b, 10c have different lengths a, c along the first and third direction A, C. The MR scanning range 10a partially overlaps with the MR scanning range 10b. The MR scanning range 10b does not overlap with the MR scanning range 10c. The situation shown in FIG. 2 only serves as an illustration. Different patients 211 have different MR scanning ranges 10a, 10b, 10c. Furthermore, an allocation between anatomic regions and MR scanning ranges 10a, 10b, 10c is flexible and can be varied.

For example, in the case of FIG. 2, the MR scanning range 10a comprises the anatomic region "chest"; the MR scanning range 10b comprises the anatomic region "abdomen"; and the MR scanning range 10c comprises the anatomic region "pelvis". Generally, the different MR scanning regions can be freely selected, for example, based on the medical specifications or the specifications of MR imaging. Therefore, the examples used here should not be viewed in a restrictive manner. Subsequently, FIGS. 9 and 10 demonstrate how a different determination can take place for the MR scanning range 10a based on the anatomic regions.

Figure 9:
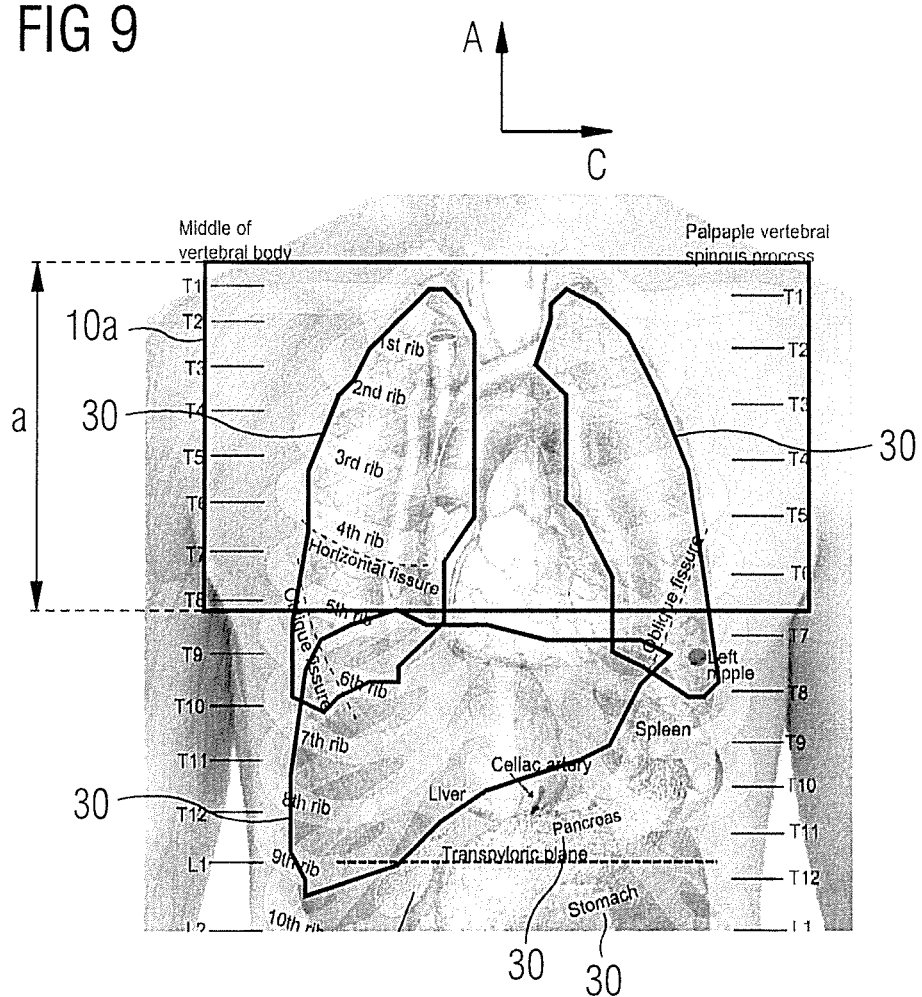
FIG. 9 shows the determination of an MR scanning range "lung" based on anatomic regions.

FIG. 9 shows the MR scanning range 10a with regard to the anatomic regions 30, for example, lung, collar bone, liver, ribs, stomach, etc. The lengths of the MR scanning range 10a are selected in such a way that it extends in cranial-caudal direction, i.e., along the first direction A, from the highest collar bone to the liver, in right-left direction from the right humerus to the left humerus and in anterior-posterior direction (not shown in FIG. 9) along the greatest distance between the anterior and posterior skin surface, including the chest.

Figure 10:
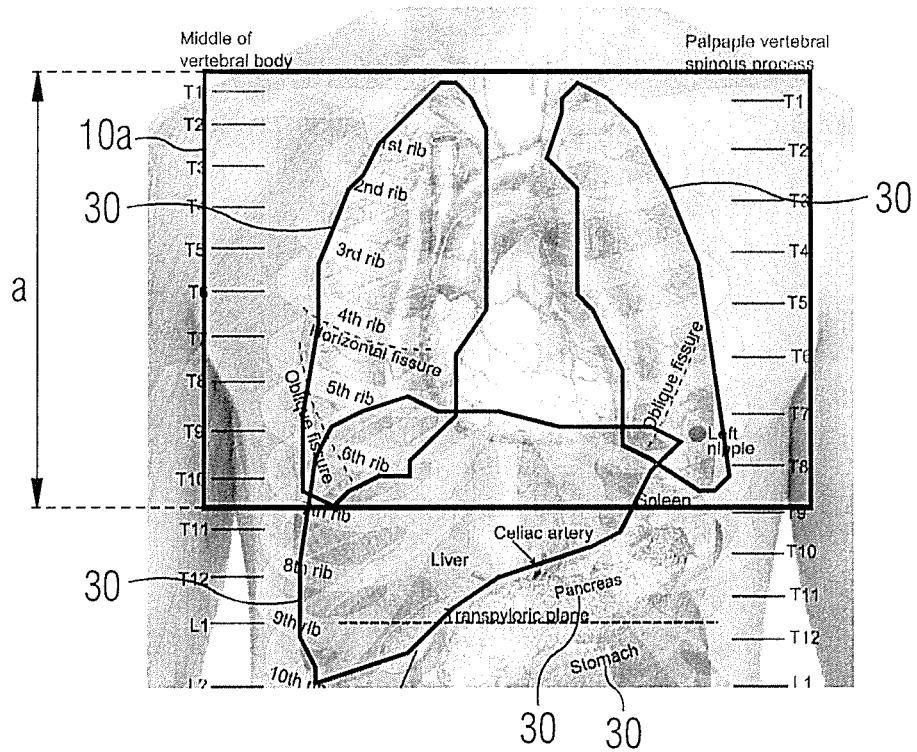
FIG. 10 shows a determination of the MR scanning range "lung" as an alternative to FIG. 9.

FIG. 10 shows an alternative selection of the MR scanning range 10. The MR scanning range 10a shown in the embodiment represented in FIG. 10 includes the entire lung (contrary to FIG. 9) and thus also part of the liver. Accordingly, the length a along the first direction A in the embodiment shown in FIG. 9 is shorter than in FIG. 10. FIGS. 9 and 10 have the purpose of illustrating different possibilities for selecting the MR scanning ranges 10a, 10b, 10c based on anatomic regions and should therefore not be viewed in a restrictive manner. It should be understood that different allocations can be implemented, depending on the preference of the operator. However, the allocation of the MR scanning ranges 10a, 10b, 10c to the anatomic regions 30 can take place automatically, for example, based on pre-defined criteria, such as described above.

Figure 3:
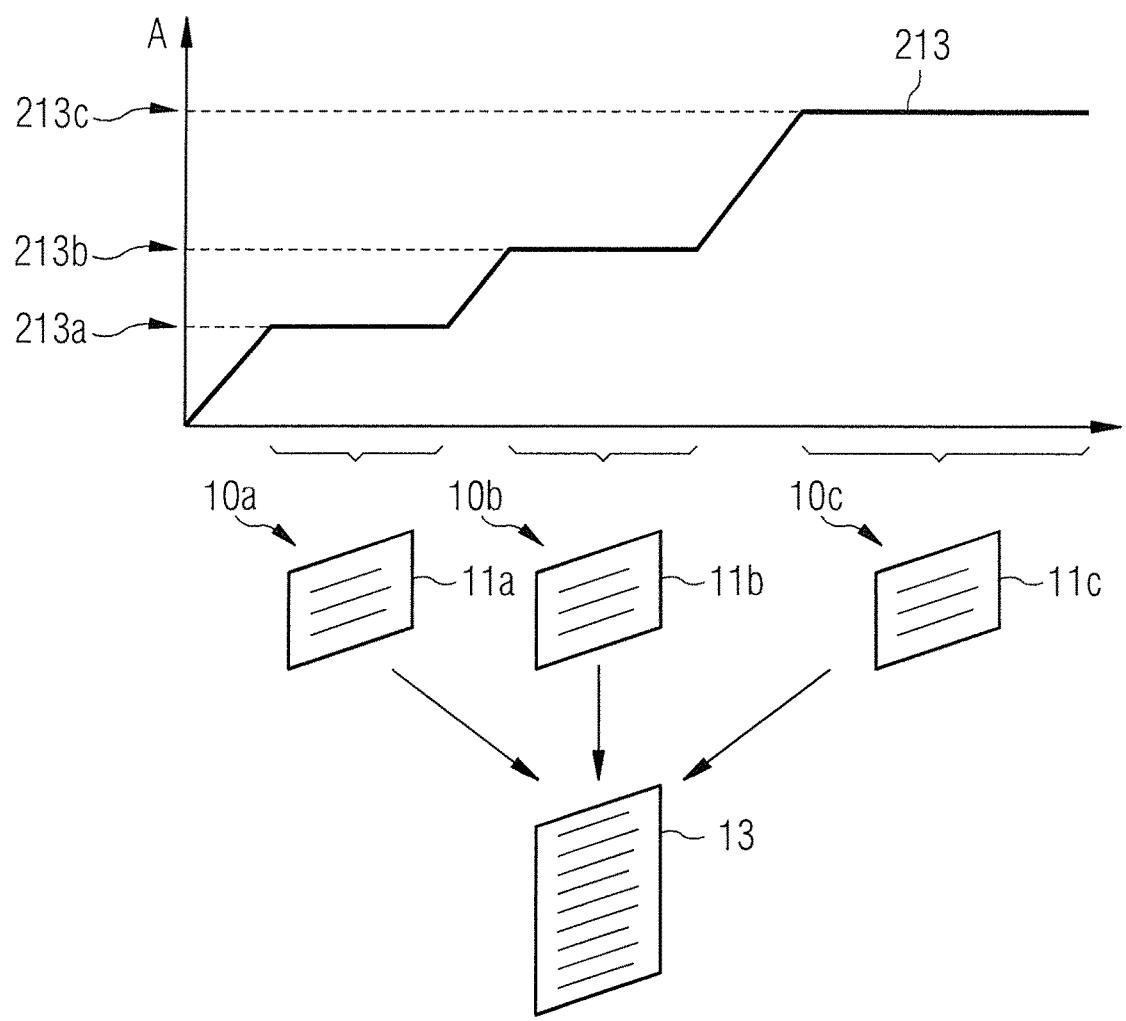
FIG. 3 shows the positioning of the patient along the first direction for recording MR partial images for the MR scanning ranges.

FIG. 3 shows the process of recording the MR partial images 11a, 11b, 11c for the different MR scanning ranges 10a, 10b, 10c for different positions 213a, 213b, 213c of the table 213 (and thus the patient 211) along the first direction A. This is characteristic for multi-station MR scanning. For the is purpose, the table 213 is successively positioned at the positions 213a, 213b, 213c, so that the respective MR scanning range 10a, 10b, 10c is arranged in the imaging volume 251 of the MR system. As a result, all pixels of the respective MR partial images 11a, 11b, 11c can be recorded within the imaging volume 251. By means of image composition technologies, the MR overall image 13 is composed from the MR partial images 11a, 11b, 11c (shown at the bottom of FIG. 3).

It could be required by means of conventional methods to plan and adjust the MR scanning ranges 10a, 10b, 10 shown in FIG. 2 manually, making it possible to compose without any problems the MR partial images 11a, 11b, 11c to an MR overall image. For example, when the MR scanning ranges 10a, 10b, 10c have different lengths a, b, c and/or different overlaps to the adjacent MR scanning ranges (i.e., corresponding to a specific situation, like the one shown in FIG. 2), a composition to the MR overall image 13 is not at all possible or only to a certain extent. Therefore, it is frequently required to perform an extensive and error-prone manual adjustment of the MR scanning ranges 10a, 10b, 10c. Subsequently, technologies are described which allow for an invention-based automatic planning and adjustment of the MR scanning ranges 10a, 10b, 10c, prior to recording the MR partial images 11a, 11b, 11c.

First, reference is made to FIG. 4. FIG. 4 shows the situation depicted in FIG. 2 based on an actual MR overview image 12. In FIG. 4, the MR overview image 12 is shown on the left side in an anterior-posterior view. On the left side of FIG. 4, supplementary to FIG. 2, the length b along the second direction B of the MR scanning range 10a is shown.

FIG. 5 shows the same situation as shown in FIG. 4, wherein the lengths a, b, c of the MR scanning ranges 10a, 10b, 10c are adjusted to one another by means of invention-based technologies. As a result, the MR scanning ranges 10a, 10b, 10c have the same volume and a defined overlap 20 to one another. For MR scanning ranges 10a, 10b, 10c adjusted in such a manner and the respective MR partial images 11a, 11b, 11c, it is possible to compose the MR overall image 13 in a simple and precise manner. Subsequently, a detailed description is provided about the different steps leading from the situation shown in FIG. 4 to the situation shown in FIG. 5.

When adjusting the lengths a, b, c of the MR scanning ranges 10a, 10b, 10c, different technologies can used for the different directions A, B, C. First of all, with regard to FIG. 6, an adjustment along the first direction A is described.

On the left side of FIG. 6, a situation is shown that can be compared with that in FIG. 4. This means that the MR scanning ranges 10a, 10b are determined by means of anatomic regions 30. In particular, both MR scanning ranges 10a, 10b have different lengths a along the first direction A. Furthermore, the MR scanning ranges 10a, 10b have only a minor overlap 20. On the left side of FIG. 6, also the geometric central points 10a', 10b' (in the A-C plane, i.e., left-right view) of the MR scanning ranges 10a, 10b are shown.

According to the invention, first of all the length a along the first direction A of the smaller MR scanning range, here MR scanning range 10b, is adjusted to the length of the greater MR scanning range, here MR scanning range 10a. The situation in which the MR scanning ranges 10a, 10b have equal lengths a along the first direction A is shown in the center of FIG. 6. Here, the adjustment of the length a along the first direction A of the MR scanning range 10b takes place in such a way that the central point 10b' has not been shifted or only to a minor degree. The central point 10b' shown on the left side of FIG. 6 coincides with the central point 10b' shown in the center of FIG. 6. This means that with regard to the first direction A the MR scanning range 10b is extended equally or by the same lengths on the left and right side of the central point 10b' (in FIG. 6: on the top and bottom).

FIG. 6 shows only two MR scanning ranges 10a, 10b. However, it is also possible to use more MR scanning ranges, for example three or four or five, etc. In general, it is possible to determine a first maximum length along the first direction which corresponds with the length of the longest MR scanning range 10a, 10b, 10c in the first direction. Then the length a along the first direction A of the MR scanning ranges 10a, 10b, 10c can be set equal to the determined first maximum length. As described above, this setting can take place in the way that the position of the central point 10a', 10b' remains constant along the first direction.

In the situation shown in the center of FIG. 6, the overlap 20 between the MR scanning ranges 10a, 10b are comparatively minor. In particular, the overlap 20 is smaller than a predetermined overlap threshold value. Therefore, the extension of the length a of the MR scanning ranges 10a', 10b' occurs by a difference length along the first direction A until the overlap 20 is equal to the overlap threshold value. This situation is shown on the right side of FIG. 6. By providing the respective overlap 20, it can be ensured that a composition of the MR overall image 13 from the MR partial images 11a, 11b, 11c takes place in a simple and extremely precise manner. Also after an extension regarding the overlap 20, the MR scanning ranges 10a, 10b have equal lengths along the first direction. This can mean that adjacent MR scanning ranges 10a, 10b are extended by equal difference lengths.

On the left side on FIG. 4, the MR scanning range 10a that corresponds with the anatomic region "lung" is shown. For reasons of clarity, not further MR scanning ranges are shown. It is possible that the length a of the MR scanning range 10a along the first direction A is greater than a predetermined length threshold value. In this case, as shown in FIG. 7, it is possible to divide the MR scanning range 10a into two MR scanning ranges 10aa, 10ab (see center of FIG. 7). In particular, the predetermined threshold value can be selected depending on the (for example, equal) length of the imaging volume 251 along the direst direction A of the MR system 230. By dividing the MR scanning range 10a into two MR scanning ranges 10aa, 10ab, it can be achieved that the MR partial images 11a, 11b, 11c for the respective MR scanning ranges record only pixels within the imaging volume 251. For example, the division of the MR scanning range 10a can take place symmetrically in relation to the central point 10a'.

The right side of FIG. 7 shows that it is possible to perform a threshold value comparison with regard to the overlap threshold value (see FIG. 6). The overlap 20 can be selected by increasing the lengths of the MR scanning ranges 10aa, 10ab to be equal or greater than the overlap threshold value.

In general, it is possible to perform first the extension of FIG. 6 and then the division of FIG. 7 or the other around start with the division of FIG. 7.

The preceding explanations mainly discussed the adjustment of the length a along the first direction A. In this connection, it was shown how the length a is set equal to the first maximum length by maintaining the central point 10a', 10b', 10c' (see FIG. 6). Furthermore, it was shown how the overlap 20 between adjacent MR scanning fields 10a, 10b, 10c can be achieved through selective extension. In addition, it was shown how the division of an MR scanning range 10a into two MR scanning ranges 10aa, 10ab can be performed in order to allow the MR partial images 11a, 11b, 11c to be recorded within the imaging volume 251 (see FIG. 7).

Regarding the lengths b, c along the second and third direction B, C: here also the lengths b, c can be set equal to the respective length of the respectively longest MR scanning range 10a, 10b, 10c along the second direction B or the third direction C. Thus it is accomplished that the MR scanning ranges 10a, 10b, 10c have equal lengths.

A comparison of FIG. 4 with FIG. 5 shows that the lengths b, c of the MR scanning ranges 10a, 10b, 10c can be set in such a way that the central points 10a', 10b', 10c' of the MR scanning ranges coincide with the second and third direction B, C. In FIG. 5, this is indicated by a vertically dotted line. In other words, the setting of the lengths b, c is performed in such a way that the edges of the MR scanning ranges 10a, 10b, 10c are arranged along the second and third direction B, C in extension to one another. For example, the central points 10a', 10b', 10c' of the MR scanning ranges 10a, 10b, 10c in the second direction B (third direction C) can be set equal to the central point of the longest MR scanning range 10a', 10b', 10c' in the second direction B (third direction C).

For example, by using the user interface 212, it is possible to release graphically the different MR scanning ranges 10a, 10b, 10c to a user of the MR system 230. It is also possible to store schematic drawings without indicating dimensions, for example, in the form of electronic graphics, such as vector graphics.

FIG. 8 shows a flow diagram of an invention-based method for multi-stage MR imaging. The method starts with step S1. In step S2, the MR overview image 12 is received. For example, the overview image 12 can be recorded with MR imaging when the table 213 is continuously moving. In particular, the overview image 12 can have a comparatively low spatial resolution. The MR overview image can display all relevant anatomic regions 30 of the patient 211. For example, the MR overview image 12 can basically display the entire patient 211. It is also possible that the MR overview image 12 is received by a memory and/or recorded by means of a different imaging method, for example CT or PET.

In step S3, the identification of the anatomic regions 30 takes place based, for example, on anatomic landmarks. For this purpose, an anatomic image recognition or object recognition can be performed with automatic segmentation of the MR overview image 12.

In step S4, the determination of the MR scanning ranges 10a, 10b, 10c takes place based on the anatomic regions 30 identified in step S3. For example, the MR scanning ranges 10a, 10b, 10c, respectively, can be determined in such a way that they include at least one entire or partial anatomic region 30 of the patient 11. However, it should be understood that different techniques can be used for determining the MR scanning ranges 10a, 10b, 10c from the anatomic regions 30. Two possibilities were previously shown in the context of FIGS. 9 and 10.

In step S5, the first maximum length is determined as the length of the longest MR scanning range 10a, 10b, 10c in the first direction. Correspondingly, in step S6 (S7), the second maximum length (third maximum length) is determined, respectively, as the length of the respectively longest MR scanning range 10a, 10b, 10c in the second direction B (third direction C).

In step S8, the length a along the first direction A of the MR scanning ranges 10a, 10b, 10c is set equal to the first maximum length of step S5. Then the MR scanning ranges have equal lengths a along the first direction A. In this connection, the length a is set in such a way that the central points 10a', 10b', 10c' of the MR partial regions 10a, 10b, 10c are not shifted. This was described in connection with FIG. 6.

In step S9, the length b along the second direction B of the MR scanning ranges 10a, 10b, 10c is set equal to the second maximum length of step S6. In this connection, the central points 10a', 10b', 10c' of the MR scanning ranges 10a, 10b, 10c are set equal to the central points of the longest MR scanning range 10a, 10b, 10c in the second direction b. Thus it is accomplished that the edges of the MR scanning ranges 10a, 10b, 10c have equal lengths b along the second direction B and coincide with the direction of the second direction B. Step S10 corresponds with step S9 with regard to the third direction C. The setting of the length with regard to the second and third direction B, C was discussed in the context of FIGS. 4 and 5.

In step S11, the threshold value of the overlap 20 between two adjacent MR scanning ranges 10a, 10b, 10c is compared with the predetermined overlap threshold value (see FIG. 6). It is examined whether the overlap between adjacent MR scanning ranges 10a, 10b, 10c is greater or equal to the overlap threshold value. When this is not the case, in step S12, the respective MR scanning ranges 10a, 10b, 10c are extended to the extent that the overlap 20 is greater or equal to the overlap threshold value. In this connection, the extension can take place in asymmetrical manner in relation to the central point 10a', 10b', 10c', or in symmetrical manner in relation to the central points 10a', 10b', 10c'.

In step S13, a further threshold value comparison is performed in which the length a of the MR scanning ranges 10a, 10b, 10c along the first direction is compared with a predetermined length threshold value (see FIG. 7). When the length of the MR scanning ranges 10a, 10b, 10c along the first direction A is greater than said length threshold value, the MR scanning ranges 10a, 10b, 10c along the first direction A are divided in two (step S14). For example, the division in step S14 can take place in symmetrical manner in relation to the original central point 10a', 10b', 10c'.

Step S14, in turn, can take into consideration the overlap 20 between the two-part MR scanning ranges, for example, in such a way that the overlap 20 is greater or equal to the overlap threshold value. Alternatively or additionally, it is also possible to perform steps S13 and S14 prior to the steps S11 and S12.

In step S15, MR parameters, for example, the number of pixels, concentration of pixels, echo time, repeat time between excitation pulses, MR sequence type, acceleration factor, etc. are selected for an MR measuring sequence. For this purpose, the selection in step S15 can take place in such a way that time required for performing the MR measuring sequence, i.e., for recording an individual MR partial image 11a, 11b, 11c is less or equal to a time threshold value. For example, a smaller (greater) number of pixels reduces (increases) the period for performing the MR measuring sequence.

In step S16, the MR partial images 11a, 11b, 11c are recorded with the MR measuring sequence for the MR scanning ranges 10a, 10b, 10c that characterize the MR parameters selected in step S15. In step S17, the MR overall image is composed from the MR partial images 11a, 11b, 11c recorded in step S16. The method end with step S18.

The invention has been illustrated and described in detail by means of the preferred embodiments. However, the invention is not restricted by the disclosed examples, and a professional is able to derive further variations without leaving the scope of protection of the invention.

For example, it is possible to perform the different steps shown in FIG. 8 in a different sequence. It is possible to perform the process of dividing of the MR scanning ranges in step S14 prior to performing the extension in step S12. Different steps in the flow diagram of FIG. 8 are optional, for example S9-S15.

While the units in FIG. 1 are depicted as single elements, it should be understood that it is also possible to combine particular units, for example, as hardware and/or software.

In particular, FIG. 1 illustrates the units with regard to their functionality. It is possible to implement the functionality of the units through software codes or hardware elements of higher-level units.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for automated magnetic resonance (MR) imaging of a patient, comprising:

providing a processor with an MR overview image that represents a patient who is to be subsequently examined in a scan using an MR data acquisition unit having an imaging volume;

in said processor, designating, within said MR overview image, a plurality of respectively different scanning ranges respectively for acquiring MR partial images from the patient in the subsequent scan, that each comprise respectively different anatomic regions of the patient, each of said scanning ranges having a length along a selected direction that is dependent on the anatomic region thereof and at least two of said lengths being different from each other;

in said processor, identifying a longest scanning range, among said plurality of scanning ranges, that has a longest length along said selected direction, and defining said longest length of said longest scanning range as a maximum length;

in said processor, executing a check to determine whether the longest length of the longest scanning range exceeds a length of said imaging volume of said data acquisition unit in said selected direction;

in said processor, the length along said selected direction of each of said scanning regions to be equal to said maximum length only if said check determines that said maximum length does not exceed the length of said imaging volume in said selection direction;

positioning the patient in said MR data acquisition unit along said selected direction and operating said MR data acquisition unit to acquire the respective MR partial images, that respectively represent the anatomic regions within the respective scanning ranges extended to said maximum length; and in said processor, composing an overall MR image of the patient by combining said MR partial images, and making said overall MR image available at an output of the processor in electronic form, as a data file.

2. A method as claimed in claim 1 comprising, in said processor, when determining said scanning ranges, setting the respective links thereof to maintain a position of a central point in each of the respective scanning ranges to be basically constant along said selected direction.

3. A method as claimed in claim 1 wherein said selected direction is a first direction, and comprising;

in said processor, determining said plurality of scanning ranges to have, in addition to said length in said first direction, a length in a second direction and a length in a third direction, said first direction, said second direction and said third direction being orthogonal to each other;

in said processor, identifying a scanning range, among said plurality of scanning ranges that has a longest length along said second direction and defining said longest length along said second direction as a maximum second length;

in said processor, identifying a scanning range, among said plurality of scanning ranges that has a longest length along said third direction and defining said longest length along said third direction as a maximum third length;

in said processor, for each of said scanning ranges, setting the length along the second direction to be equal to said second maximum length; and in said processor, for each of said scanning ranges, setting the length along the third direction to be equal to said third maximum length.

4. A method as claimed in claim 3 comprising:

in said processor, setting said length along said second direction to cause a position of a central point of the scanning ranges along said second direction to be equal to a position of the central point of the scanning range having said longest length along said second direction; and in said processor, setting said length along said third direction to cause a position of a central point of the scanning ranges along said third direction to be equal to a position of the central point of the scanning range having said longest length along said third direction.

5. A method as claimed in claim 3 comprising, during operation of said MR data acquisition unit to generate said MR partial images, activating spatially encoding magnetic gradient fields, and respectively adjusting said magnetic gradients fields along at least one of said first direction, said second direction and said third direction.

6. A method as claimed in claim 1 comprising:

in said processor, for each of said scanning ranges, comparing an extent of any overlap that exists along said selected direction between adjacent scanning ranges, to a threshold value, to obtain an overlap comparison result; and in said processor, selectively extending the length along said selected direction for all of said scanning ranges dependent on said overlap comparison result.

7. A method as claimed in claim 1 comprising operating said MR data acquisition unit with the same MR data acquisition sequence to acquire all of said MR partial images.

8. A method as claimed in claim 7 comprising, in said processor, setting parameters for said MR measuring sequence selected from the group consisting of number of pixels in each of said MR partial images, concentration of pixels in each of said MR partial images, an echo time during which magnetic resonance signals for said MR partial images are acquired, and a repetition time between radiated radio-frequency excitation pulses that excite nuclear spins in the patient to generate MR signals for each of said MR partial images.

9. A method as claimed in claim 8 comprising setting said parameters dependent on the maximum length along said selected direction of said scanning ranges.

10. A method as claimed in claim 1 comprising:

in said processor, comparing said maximum length, to which the length along the selected direction of each of said scanning ranges has been set, to a predetermined length threshold value; and when said maximum length exceeds said length threshold value, automatically dividing, in said processor, each of said scanning ranges into two scanning ranges.

11. A magnetic resonance (MR) apparatus comprising:

an MR data acquisition unit having an imaging volume;

a processor provided with an MR overview image that represents a patient who is to be subsequently examined in a scan using an MR data acquisition unit;

said processor being configured to designate, within said MR overview image, a plurality of respectively different scanning ranges respectively for acquiring MR partial images from the patient in the subsequent scan, that each comprise respectively different anatomic regions of the patient, each of said scanning ranges having a length along a selected direction that is dependent on the anatomic region thereof and at least two of said lengths being different from each other;

said processor being configured to identify a longest scanning range, among said plurality of scanning ranges, that has a longest length along said selected direction, and defining said longest length of said longest scanning range as a maximum length;

said processor being configured to execute a check to determine whether the longest length of the longest scanning range exceeds a length of said imaging volume of said data acquisition unit in said selected direction;

said processor being configured to extend the length along said selected direction of each of said scanning regions to be equal to said maximum length only if said check determines that said maximum length does not exceed the length of said imaging volume in said selection direction;

a control unit configured to operate the MR data acquisition unit with the patient positioned in the MR data acquisition unit along said selected direction, to acquire the respective MR partial images, that respectively represent the anatomic region within the respective scanning ranges extended to said maximum length; and said processor being configured to compose an overall MR image of the patient by combining said MR partial images, and to make the overall MR image available at an output of the processor in electronic form, as a data file.

* * * * *